United States Patent
Murai et al.

(10) Patent No.: US 8,395,173 B2
(45) Date of Patent: Mar. 12, 2013

(54) SEMICONDUCTOR LIGHT-EMITTING ELEMENT, METHOD OF MANUFACTURING SAME, AND LIGHT-EMITTING DEVICE

(75) Inventors: Akihiko Murai, Hioki Kogoshima (JP); Hiroshi Fukshima, Kadoma (JP)

(73) Assignee: Panasonic Corporation, Osaka (JP)

( * ) Notice: Subject to any disclaimer, the term of this patent is extended or adjusted under 35 U.S.C. 154(b) by 146 days.

(21) Appl. No.: 13/126,525

(22) PCT Filed: Oct. 28, 2009

(86) PCT No.: PCT/JP2009/068488
§ 371 (c)(1),
(2), (4) Date: Apr. 28, 2011

(87) PCT Pub. No.: WO2010/050501
PCT Pub. Date: May 6, 2010

(65) Prior Publication Data
US 2011/0215296 A1 Sep. 8, 2011

(30) Foreign Application Priority Data

Oct. 29, 2008 (JP) ................................ 2008-278801

(51) Int. Cl.
*H01L 33/38* (2010.01)
*H01L 33/42* (2010.01)
*H01L 33/48* (2010.01)
(52) U.S. Cl. ..... 257/98; 257/99; 257/103; 257/E33.068; 257/E33.07; 257/E33.074; 438/29; 438/46
(58) Field of Classification Search .................... 257/79, 257/98, 99, 103, E33.068, E33.07, E33.074; 438/29, 46
See application file for complete search history.

(56) References Cited

U.S. PATENT DOCUMENTS

| 2004/0061433 A1 | 4/2004 | Izuno et al. |
| 2007/0001186 A1 | 1/2007 | Murai et al. |

FOREIGN PATENT DOCUMENTS

| EP | 1 959 503 A1 | 8/2008 |
| JP | 2002-94186 A | 3/2002 |

(Continued)

OTHER PUBLICATIONS

"New Type LED by Panasonic Electric Works and UCSB; Targeting at Achieving 80% Efficiency of External Quantum Efficiency Increasing the Light Extraction Efficiency by Use of ZnO Substrate", Nikkei Electronics, 2008, pp. 16 and 17.

(Continued)

*Primary Examiner* — Evan Pert
(74) *Attorney, Agent, or Firm* — McDermott Will & Emery LLP

(57) ABSTRACT

A semiconductor light-emitting element, a method of manufacturing same, and a light-emitting device enabling an increase in light emission efficiency is provided. The semiconductor light-emitting element 1 in accordance with the present invention includes: a light-emitting layer 2 having a laminated structure in which a p-type GaN film 24 and an n-type GaN film 22 are included; a conductive hexagonal pyramidal base 3 formed from ZnO and mounting with the light-emitting layer on a bottom surface 31; an anode 5 joined to the bottom surface 31 of the base 3 at a position apart from the light-emitting layer 2; and a cathode 4 mounted on the light-emitting layer 2. In the semiconductor light-emitting element 1, the p-type GaN film 24 is joined to the bottom surface 31 of the base 3, and the cathode 4 is joined to an N-polar plane of the n-type GaN film 22, said N-polar plane of the n-type GaN film 22 being an opposite side to the p-type GaN film 24. In the semiconductor light-emitting element 1, the N-polar plane of the n-type GaN film 22 has a fine peak-valley structure 22c outside a portion joined to the cathode 4.

13 Claims, 8 Drawing Sheets

FOREIGN PATENT DOCUMENTS

| | | |
|---|---|---|
| JP | 2007-165409 A | 6/2007 |
| JP | 2008-60331 A | 3/2008 |
| JP | 2008-66557 A | 3/2008 |
| JP | 2008-205511 A | 9/2008 |
| JP | 2008-244425 A | 10/2008 |
| JP | 4338768 B1 | 7/2009 |
| WO | WO-2006/138626 A2 | 12/2006 |

OTHER PUBLICATIONS

International Search Report for the Application No. PCT/JP2009/068488 mailed Dec. 8, 2009.

SEMICONDUCTOR LIGHT-EMITTING ELEMENT, METHOD OF MANUFACTURING SAME, AND LIGHT-EMITTING DEVICE

TECHNICAL FIELD

The present invention relates to a semiconductor light-emitting element, a method of manufacturing same, and a light-emitting device.

BACKGROUND ART

Research and development aimed at increase in efficiency and output of semiconductor light-emitting elements including a LED chip in which a light-emitting layer is formed from a nitride semiconductor material (GaN, InGaN, AlGaInN, etc.) have been heretofore widely conducted. Research and development of light-emitting devices emitting mixed color light with a different color from that of an emission color of semiconductor light-emitting elements have also been widely conducted by combining the semiconductor light-emitting elements of this type with fluorescent materials, and abundant research and development have been performed to expand the application of such light-emitting devices to a general illumination field. Such light-emitting devices use the fluorescent material as a wavelength conversion material that is excited by light emitted from the semiconductor light-emitting element and emits light with a wavelength longer than that of the semiconductor light-emitting element. Commercially, for example, such light-emitting devices have been produced as white light-emitting devices (typically referred to as white LED) for obtaining white color light (emission spectrum of white light) by combining a semiconductor light-emitting element emitting blue light or violet light and a fluorescent material.

A configuration in which a fine peak-valley structure is formed by providing pyramidal protrusions of a several micron size on the surface side of an n-type GaN film 22' of a semiconductor light-emitting element, for example, as shown in FIG. 8, has been suggested for efficiently taking out (extracting) the light emitted from the light-emitting layer to the outside with the object of increasing the light output of the above-described semiconductor light-emitting element. In the semiconductor light-emitting element shown in FIG. 8, a light-emitting layer 2' has a laminated structure of a p-type GaN film 24', a light-emitting film 23' and the n-type GaN film 22', and yet the p-type GaN film 24' is bonded to the top surface of a Si substrate 6', with a metal film 7' being interposed therebetween, and an anode 5' is formed on the lower surface of the Si substrate 6'. In this configuration, the metal film 7' plays a role of ensuring ohmic electric conductivity between the p-type GaN film 24' and the Si substrate 6', a role of reflecting the light that has passed through the p-type GaN film 24' towards the light-emitting film 23' side, and a role of joining the p-type GaN film 24' and the Si substrate 6'.

However, in the case that the fine peak-valley structure is formed over the entire upper surface of the n-type GaN film 22' as well as an island-like cathode 4' composed of a laminated film including, for example, a Ti film, an Al film and a Au film, is formed on the top surface of the n-type GaN film 22', as in the semiconductor light-emitting element of the configuration shown in FIG. 8, the light incoming from the n-type GaN film 22' side is easily absorbed and light emission efficiency is decreased. Further, in the semiconductor light-emitting element shown in FIG. 8, a reflectance of the metal film 7' can be increased to increase the light extraction efficiency. However in this case, it is necessary to maintain the electric conductivity and bonding strength, therefore, the yield drops and the productivity decreases.

Further, in the semiconductor light-emitting element shown in FIG. 8, the pyramidal protrusions are formed by performing crystal anisotropic etching of the n-type GaN film 22' by using a KOH solution. Therefore, the size and density of pyramidal protrusions strongly depend on such as crystallinity of the n-type GaN film 22', reproducibility of size and density of the pyramidal protrusions is low, and the light extraction efficiency causes a variation, therefore the light-emission efficiency causes a variation, and cost is increased due to drop of the yield.

Further, a semiconductor light-emitting element as shown in FIG. 9 has also been suggested, in which a fine peak-valley structure 8a' is formed on the upper surface of a sapphire substrate 8' as well as a light-emitting layer 2' having a laminated structure including an n-type GaN film 22', a light-emitting film 23' and a p-type GaN film 24' is formed on the upper surface of the sapphire substrate 8'. In the semiconductor light-emitting element shown in FIG. 9, a transparent conductive film 25' composed of an ITO film is formed over the entire upper surface of the p-type GaN film 24', an island-like anode 5' is formed on the transparent conductive film 25', and an island-like cathode 4' is formed on upper surface of the n-type GaN film 22'. In the semiconductor light-emitting element shown in FIG. 9, the island-like cathode 4' is formed on the surface of the n-type GaN film 22' after being exposed by etching a predetermined region of the laminated film including the n-type GaN film 22', the light-emitting film 23' and the p-type GaN film 24' formed on the upper surface of the sapphire substrate 8'.

In the semiconductor light-emitting device shown in FIG. 9, the fine peak-valley structure 8a' is formed on the interface between the sapphire substrate 8' and the n-type GaN film 22', and the light extraction efficiency is raised and light emission efficiency is increased by changing the propagation direction of light inside the semiconductor light-emitting element by the fine peak-valley structure 8a'.

However, in the semiconductor light-emitting element shown in FIG. 9, it has been also desired to increase further the light emission efficiency. In case the light transmittance of the transparent conductive film 25' is raised to increase further the light extraction efficiency, the electric conductivity is difficult to maintain. Therefore, the light emission efficiency is difficult to increase.

A semiconductor light-emitting element shown in FIG. 10 has been suggested that includes a p-type GaN film 24', a light-emitting layer 23', an n-type GaN film 22', a cathode 4' formed on the flat surface in the center of the upper surface of the n-type GaN film 22', an anode 5' formed on the lower surface of the p-type GaN film 24', and a support substrate (not shown in the figure) joined to the lower surface of the anode 5' via a joining layer (not shown in the figure) composed of a conductive material (see, for example, Japanese Patent Application Laid-Open No. 2008-60331). In such a semiconductor light-emitting element, in order to increase the light extraction efficiency, a fine peak-valley structure is formed by way of crystal anisotropic etching using a KOH solution outside a formation portion of the cathode 4' on the upper surface of the n-type GaN film 22'. The anode 5' of such semiconductor light-emitting element is composed of a contact ZnO film 5a', a Schottky ZnO film 5b' that is in contact with the p-type GaN film 24' only in the projection region of the cathode 4', and a current diffusion ZnO film 5c'.

In the semiconductor light-emitting element shown in FIG. 10, the cathode 4' is formed on the flat surface of the n-type GaN film 22', thereby making it possible to inhibit light absorption by the cathode 4'. Furthermore, since the contact resistance in the anode 5' with the p-type GaN film 24' in the projection region of the cathode 4' is larger than the contact resistance with the p-type GaN film 24' in the region outside this projection region, the concentration of electric current immediately below the cathode 4' can be relaxed, the ratio of light absorbed or blocked by the cathode 4' can be reduced, and light extraction efficiency can be increased.

With the object of increasing the light extraction efficiency, a semiconductor light-emitting element has recently been suggested in which a light-emitting layer having an n-type GaN film and a p-type GaN film is joined to a base formed from transparent and conductive n-type ZnO, and the base is processed into a hexagonal pyramidal shape by way of crystal anisotropic etching utilizing the dependence of etching rate on crystal orientation (see, for example, the following non-patent document: "Matsushita Denko to UCSB-no Shingata LED, Gaibu Ryoshi Koritsu 80% Mezasu" (New Type LED by Panasonic Electric Works and UCSB; Targeting at Achieving 80% External Quantum Efficiency) (Nikkei Electronics, Nikkei BP Sha, Feb. 11, 2008, p. 16-17)).

The semiconductor light-emitting element disclosed in this Non-Patent Document is provided with the light-emitting layer and the base formed of the hexagonal pyramidal n-type ZnO substrate joined to the light-emitting layer, wherein an anode is formed on the lower surface of the base, a cathode is formed on the lower surface of the n-type GaN film of the light-emitting layer, and the anode and the cathode are joined to mutually different wiring patterns (conductive patterns) of the mounting Substrate by use of bumps.

However, in the semiconductor light-emitting element of the configuration shown in FIG. 10, the light is assumed to be taken out mainly from the fine peak-valley structure of the n-type GaN film 22'. Therefore, the light emitted from the light-emitting film 23' towards the p-type GaN film 24' is absorbed by a joining layer, or reflected by the joining layer to fall on the light-emitting layer and be absorbed thereby. The resultant problem is that the light emission efficiency is low.

Further, in the semiconductor light-emitting element disclosed in the aforementioned non-patent document, the refractive index of the base is less than the refractive index of the p-type GaN film. Therefore, the light with a small incidence angle on the joining surface of the base and the p-type GaN film, from among the light generated by the light-emitting layer, is not introduced into the ZnO. Therefore, further increase in light emission efficiency has been desired.

DISCLOSURE OF THE INVENTION

With the foregoing in view, it is an object of the present invention to provide a semiconductor light-emitting element with increased light emission efficiency and a method of manufacturing the semiconductor light-emitting element.

The semiconductor light-emitting element in accordance with the present invention includes: a light-emitting layer having a laminated structure in which a p-type GaN film and an n-type GaN film are included; a conductive hexagonal pyramidal base formed from ZnO and mounting with the light-emitting layer on a bottom surface thereof; an anode joined to the bottom surface of the base at a position apart from the light-emitting layer; and a cathode mounted on the light-emitting layer. In the semiconductor light-emitting element, the p-type GaN film is joined to the bottom surface of the base, and the cathode is joined to an N-polar plane of the n-type GaN film, said N-polar plane being an opposite side to the p-type GaN film. In the semiconductor light-emitting element, the N-polar plane of the n-type GaN film has a fine peak-valley structure outside a portion joined to the cathode, said N-polar plane being the opposite side to the p-type GaN film.

According to the invention, the fine peak-valley structure suppresses the absorption of light generated by the light-emitting layer in the cathode, and efficiently guides the light generated by the light-emitting layer toward the outside, thereby increasing the light extraction efficiency.

The fine peak-valley structure is preferably composed of a plurality of recesses arranged two-dimensionally over the N-polar plane of the n-type GaN film. By arranging said plurality of recesses with good regularity, it is possible to increase further the light extraction efficiency.

It is preferred that the opening diameter of each of the recesses gradually increases toward the N-polar plane side of the n-type GaN film. It is also preferred that each of the recesses has a pyramidal shape. In such cases, the light extraction efficiency can be further increased.

Each of the cathode and the anode is preferably composed of a laminated film selected from: a laminated film of a Ti film, an Al film, and a Au film; a laminated film of a Ti film and a Au film; a laminated film of an Al film and a Au film; and a laminated film of a Ti film, an Al film, a Ni film, and a Au film.

With such a configuration, the outermost surface side is a Au film in each of the cathode and the anode. The Au film prevents the cathode and anode from oxidation, and increases joining reliability with Au bumps when performing flip-chip mounting on a mounting substrate or the like by using Au bumps. Furthermore, with such a configuration, since the cathode and the anode are constituted by the same metal material, good ohmic contact can be obtained and adhesion and reliability can be increased for both the cathode and the anode, while reducing the consumption of metal materials during manufacturing process.

The method of manufacturing the above-described semiconductor light-emitting element includes: forming a transfer layer on the N-polar plane of the n-type GaN film; pressing a mold die having a predetermined peak-valley pattern on one surface thereof against the transfer layer and thereby transferring the peak-valley pattern to the transfer layer; and dry etching the transfer layer and the n-type GaN layer from outer surface side and etching out the transfer layer and part of the N-polar plane of the n-type GaN layer, whereby the fine peak-valley structure is formed on the N-polar plane of the n-type GaN film.

In accordance with the invention, the peak-valley pattern can be formed with good reproducibility and the semiconductor light-emitting element with increased light emission efficiency can be provided at a low cost.

It is preferred that the above-described semiconductor light-emitting element be combined with: a mounting substrate mounting with said semiconductor light-emitting element on one surface side thereof; and a light conversion member formed from a transparent material that includes a fluorescent material excited by light emitted from the semiconductor light-emitting element and emits light with a wavelength longer than that of the semiconductor light-emitting element, said light conversion member being formed in a dome-shape and provided to surround the semiconductor light-emitting element between the mounting substrate and itself, wherein the mounting substrate is provided on the one surface side thereof with a plurality of wiring patterns connected separately from each other by bumps to the cathode and the anode of the semiconductor light-emitting element and with a reflective film that reflects light emitted from the semiconductor light-emitting element towards the mounting substrate side.

With such a configuration, it is possible to increase the emission efficiency of a mixed color light of the light emitted from the semiconductor light-emitting element and the light emitted from a fluorescent material.

BRIEF DESCRIPTION OF THE DRAWINGS

FIG. 1 shows the semiconductor light-emitting element according to Embodiment 1.

FIG. 2 shows the semiconductor light-emitting element according to Embodiment 2.

BEST MODE FOR CARRYING ON THE INVENTION

Embodiment 1

Figure 1A:
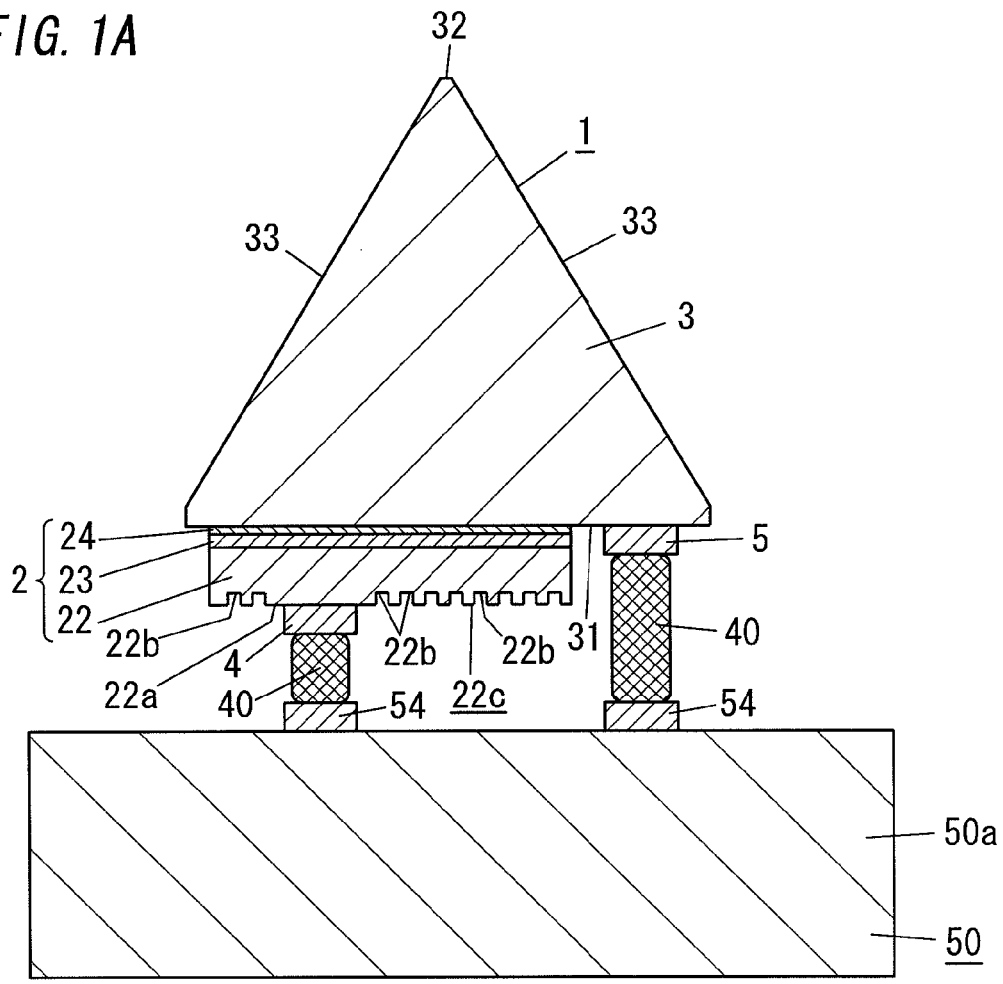
FIG. 1A is a schematic cross-sectional view illustrating a state in which the semiconductor light-emitting element is mounted on the mounting substrate.

A semiconductor light-emitting element 1 according to the present embodiment will be described below with reference to FIG. 1.

The semiconductor light-emitting element 1 according to the present embodiment is provided with a light-emitting layer 2 that is a blue LED chip of a GaN system emitting blue light, a conductive base 3 formed from n-type ZnO, a cathode 4, and an anode 5. The light-emitting layer 2 has an n-type GaN film 22 and a p-type GaN film 24. The base 3 is formed in a hexagonal pyramidal shape and has a bottom surface 31 that is directly joined to the light-emitting layer 2. The cathode 4 is formed to be in ohmic contact with the lower surface of the n-type GaN film 22 which is an N-polar plane. The anode 5 is formed to be in ohmic contact with the base 3.

In the semiconductor light-emitting element 1 according to the present embodiment, the light-emitting layer 2 has a laminated structure including the n-type GaN film 22, a light-emitting film 23, and the p-type GaN film 24. At the lower surface of the n-type GaN film 22, the island-like (in this case, a square-shaped) cathode 4 is formed on a flat portion 22a, and a fine peak-valley structure 22c is formed outside the portion where the cathode 4 is formed. The fine peak-valley structure 22c plays the role of changing the propagation direction of light emitted downward (that is, toward the side opposite to the base 3), from among the light generated by the light-emitting layer 2. Thus, in the light-emitting film 23 of the light-emitting layer 2 of the semiconductor light-emitting element 1 according to the present embodiment, the n-type GaN film 22 having the fine peak-valley structure 22c is provided on one surface, and the p-type GaN film 24 is provided on the other surface. The p-type GaN film 24 is directly joined to the base 3.

The bottom surface 31 of the base 3 is formed in a regular hexagonal shape. The light-emitting layer 2 is formed in a pentagonal shape in the plan view thereof such that four of the five sides are along the four sides of the bottom surface 31 of the base 3. On the bottom surface 31 of the base 3, the island-like (in this case, a square-shaped) anode 5 is formed at a position apart from the p-type GaN film 24. With such a configuration, the plan dimensions of the n-type GaN film 22, the light-emitting film 23, and the p-type GaN film 24 are the same in the semiconductor light-emitting element 1 according to the present embodiments. The shape, size, number, and arrangement of cathode 4 on the n-type GaN film 22 are not particularly limited. From the standpoint of increasing the heat dissipation property, it is desirable that a plurality of cathodes 4 be used. The shape and arrangement of cathodes are preferably designed with consideration for heat dissipation property. As will be described below, the light-emitting layer 2 is formed by using an epitaxial growth technique such as metalorganic vapor phase epitaxy method (MOVPE method) on the (0001) plane of the sapphire wafer prior to direct joining to the n-type ZnO wafer, where said n-type ZnO wafer serving as a foundation for the base 3. The epitaxial growth method of the light-emitting layer 2 is not limited to the MOVPE method and, for example, a hydride vapor phase epitaxy method (HVPE method) or molecular beam epitaxy method (MBE method) may be used.

The light-emitting film 23 has a quantum well structure in which a well layer composed of an InGaN layer is sandwiched between barrier layers composed of a GaN layer. The composition of the InGaN layer is set such that the emission peak wavelength of the light-emitting film 23 is 450 nm. The light emission wavelength (emission peak wavelength) is not particularly limited. The quantum well structure of the light-emitting film 23 is not limited to the single quantum well structure and may be a multiple quantum well structure. Further, it is not necessary that the light-emitting film 23 has a quantum well structure. Thus, the light emitting film 23 may have a single-layer structure. Further, the light-emitting film 23 may be also composed as appropriate from nitride semiconductor materials such as AlInGaN, AlInN, and AlGaN according to the desired light emission wavelength.

The laminated structure of the light-emitting layer 2 includes the n-type GaN film 22 and the p-type GaN film 24. This laminated structure may include, for example, only the n-type GaN film 22 and the p-type GaN film 24, or may also include a p-type AlGaN film between the light-emitting film 23 and the p-type GaN film.

GaN and ZnO are polar semiconductors having wurtzite-type crystal structure and polarity in the c axis direction. At the lower surface of the n-type GaN film 22, the flat portion 22a is constituted by the (000-1) plane which is an N-polar plane. The upper surface of the p-type GaN film 24 is constituted by the (0001) plane which is a Ga-polar plane. In the base 3, the bottom surface 31 is constituted by the (0001) plane which is a Zn-polar plane, and the upper surface 32 is constituted by the (000-1) plane which an O-polar plane. In sum, the Zn-polar plane of the base 3 is directly joined to the Ga-polar plane of the p-type GaN film 24.

The base 3 may be formed with oxygen vacancies or zinc interstitial atom defects, rather than with doping, to demonstrate the n-type conductivity. However, in order to reduce contact resistance of the ohmic contact of the base 3 with the anode 5, it is preferred that the base 3 be formed from a material in which conductivity type and electric conductivity be controlled by doping, for example, from a Ga-doped ZnO substrate (GZO substrate) or an Al-doped ZnO substrate (AZO substrate). Here, as will be described below, since the n-type ZnO wafer serving as a foundation of the base 3 according to the present embodiment is manufactured by using the hydrothermal synthesis method, the base 3 is electrically conductive (conducts electricity) and has a very high light transmittance with respect to the visible light. Therefore, the light absorption loss can be reduced.

Further, the aforementioned cathode 4 and anode 5 are constituted by laminated films of a Ti film, an Al film, and a Au film. The lowermost surface of the laminated films of the cathode 4 and anode 5 is the Au film. In the cathode 4 and the anode 5, the thickness of the Ti film is set to 10 nm, the thickness of the Al film is set to 50 nm, and the thickness of the Au film is set to 500 nm. The thickness of these films is an exemplary and not particularly limiting. In the semiconductor light-emitting element 1 according to the present embodiment, the cathode 4 and the anode 5 are made from identical metal materials and have identical electrode structure. Therefore, with respect to the cathode 4 and the anode 5, the adhesion between the films constituting the laminated films is improved, and the adhesion to the n-type GaN film 22 or the base 3 is improved. In the present embodiment, the cathode 4 and the anode 5 are formed simultaneously by an electron beam vapor deposition method (EB vapor deposition method).

A lift-off method is used for patterning the cathode 4 and the anode 5. Thus, a resist layer is formed in which the supposed formation regions of the cathode 4 and the anode 5 are open, and then the cathode 4 and the anode 5 are formed by the electron beam vapor deposition method, and then the unnecessary film present on the resist layer is removed together with the resist layer. Further, in the semiconductor light-emitting element according to the present embodiment, the n-type GaN film 22 has a comparatively large thickness of about 4 µm and the n-type GaN film 22 has a high electric conductivity. Therefore, good ohmic contact can be obtained even if the size of the cathode 4 is reduced. The thickness of the n-type GaN film 22 is not particularly limited.

In the semiconductor light-emitting element 1 according to the present embodiment, by using the laminated films of the Ti film, Al film, and Au film, as described hereinabove, as the cathode 4 and the anode 5, it is possible to obtain good ohmic contact (ohmic contact with low contact resistance) with the n-type GaN film 22 and the substrate 3, respectively. The laminated films of the cathode 4 and the anode 5 are not limited to the laminated film of the Ti film, Al film, and Au film, and may be a laminated film selected from the group including a laminated film of a Ti film and a Au film, a laminated film of an Al film and a Au film, and a laminated film of a Ti film, an Al film, a Ni film, and a Au film. In the laminated films of the cathode 4 and the anode 5 of any configuration, the lowermost surface is the Au film. The Au film prevents the cathode 4 and the anode 5 from oxidation, and increases joining reliability with bumps 40, 40 when they are mounted on the mounting substrate 50 by way of flip-chip mounting by using the bumps 40, 40 composed of Au bumps. Further, in the semiconductor light-emitting element 1 according to the present embodiment, the cathode 4 is formed on the n-type GaN film 22, the anode 5 is formed on the base 3, and the cathode 4 and the anode 5 are constituted by identical metal materials. Therefore, consumption of metal materials during manufacturing process can be reduced, good ohmic contact can be obtained for both the cathode 4 and the anode 5, adhesion can be increased, and reliability can be improved.

However, it is not necessary that the cathode 4 and the anode 5 have the same electrode structure. For example, the anode 5 may be constituted by a laminated film of a Ti film and a Au film, while the cathode 4 may be constituted by a laminated film of a Ti film, an Al film, a Ni film, and a Au film.

In the semiconductor light-emitting element 1 according to the present embodiment, by applying a forward bias voltage between the anode 5 and cathode 4, holes are injected from the anode 5 into the p-type GaN film 24 by tunnel current injection and electrons are injected from the cathode 4 into the n-type GaN film 22. Then, the electrons and holes injected into the light-emitting film 23 recombine to generate light, and the light is emitted from such as the side surfaces 33 and upper surface 32 of the base 3. With respect to the light with wavelength of 450 nm, the refractive index of ZnO is 2.1, the refractive index of GaN is 2.4, and the refractive index of air is 1.

As described hereinabove, in the semiconductor light-emitting element 1 according to the present embodiment, the fine peak-valley structure 22c that changes the propagation direction of light emitted downward (toward the side opposite to the base 3), from among the light generated by the light-emitting layer 2, is formed outside the formation region of the cathode 4 on the upper surface of the n-type GaN film. The fine peak-valley structure 22c is formed by arranging a large number of recesses 22b two-dimensionally on the lower surface of the n-type GaN film 22 (the recesses 22b are formed at grid points of virtual square grid, respectively). Therefore, a fine peak-valley pattern with good regularity is obtained. In the present embodiment, the opening of each recess 22b of the fine peak-valley structure 22c has a square shape with one side of 5 µm, the distance between the adjacent recesses 22b is 5 µm, and the angle between the inner side surface of each recess 22b and a plane including the N-polar plane that is the flat portion 22a where the cathode 4 has been formed is about 90 degrees, and therefore the fine peak-valley structure 22c has a rectangular wave-like cross-sectional shape.

Figure 1B:
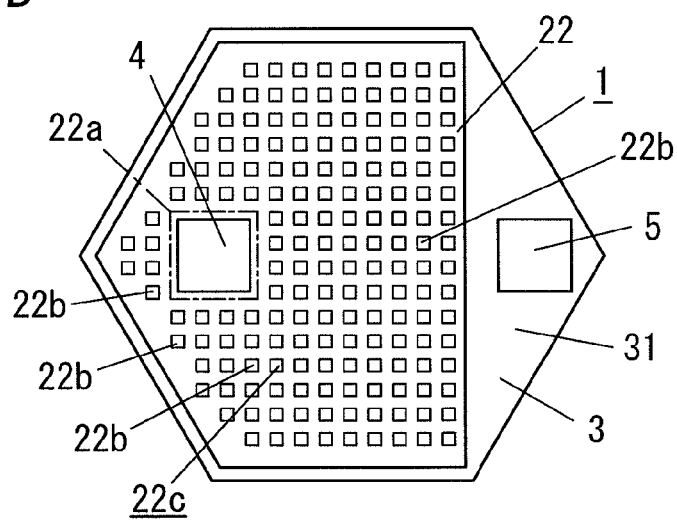
FIG. 1B is a schematic bottom view.

In the light-emitting device of the semiconductor light-emitting element 1 according to the present embodiment, which is shown in FIG. 1A, the distance from the mounting substrate 50 to the light-emitting layer 2 is closer than that to the base 3. The cathode 4 and the anode 5 are joined to wiring patterns (conductive patterns) 54, 54 formed on the upper surface of an insulating substrate 50a in the mounting substrate 50 by the bumps 40, 40 composed of Au bumps, respectively. The mounting substrate 50 also serves as a heat conductive plate that conducts the heat generated by the semiconductor light-emitting element 1. As the insulating substrate 50a, an aluminum nitride substrate is used which has a thermal conductivity higher than that of organic substrates such as a glass epoxy resin substrate. The insulating substrate 50a is not limited to the aluminum nitride substrate and may be constituted, for example, by an alumina substrate, an enameled substrate, and a silicon substrate having a silicon oxide film formed on the surface. Further, the material of the bumps 40, 40 is not limited to Au and also may be a solder, however, in order to dissipate efficiently the heat generated by the semiconductor light-emitting element 1, it is preferred to use Au, which has a thermal conductivity higher than that of the solder. Where the number of bumps 40 is large, the heat resistance between the semiconductor light-emitting element 1 and the mounting substrate 50 can be reduced and heat dissipation property can be increased. The light emission efficiency of the light-emitting device can be advantageously increased by providing a reflective film, which reflects in the desired direction the light emitted from the semiconductor light-emitting element 1 towards the mounting substrate 50 side, on the upper surface of the insulating substrate 50a.

The method of manufacturing the semiconductor light-emitting element 1 according to the present embodiment will be explained below.

The light-emitting layer 2 having a laminated structure of the n-type GaN film 22, the light-emitting film 23, and the p-type GaN film 24 is formed by the MOVPE method on the upper surface of the above-described sapphire wafer, with a buffer layer composed of non-doped GaN layer being interposed therebetween (crystal growth process). Then, the light-emitting layer 2 is patterned in the predetermined shape (the abovementioned pentagonal shape in the present embodiment) by using a photolithography technique and an etching technique (patterning process). Then, the light-emitting layer 2 located on the sapphire substrate and the n-type ZnO wafer serving as a foundation for the base 3 are directly joined to each other (joining process). The sapphire wafer is then removed from the light-emitting layer 2 (wafer lift-off process). Then, the fine peak-valley structure 22c is formed on the lower surface of the n-type GaN film 22 (fine peak-valley structure formation process). The cathode 4 and the anode 5 are then formed (electrode formation process). A mask layer patterned to the predetermined shape (shape of the upper surface 32 of the base 3) is formed on the upper side (side opposite to the light-emitting layer 2) of the n-type ZnO wafer (mask layer formation process). Then, the hexagonal pyramidal base 3 composed of part of the n-type ZnO wafer is formed by performing crystal anisotropic etching, which is based on the dependence of etching rate on crystallographic orientation, by using a hydrochloric acid-based etching solution (for example, hydrochloric acid aqueous solution) (base processing process). The mask layer is thereafter removed (mask layer removal process).

A single-crystal ZnO wafer with excellent crystallinity with a dislocation defect density of equal to or less than $10^3$ cm$^{-2}$ is used as the n-type ZnO wafer, and the wafer is manufactured by using a hydrothermal synthesis method suitable for mass production. Further, in the above-described joining process, the joining surfaces of the light-emitting layer 2 and the n-type ZnO wafer are cleaned and then the n-type ZnO wafer is superimposed on the upper side (side opposite to the sapphire wafer) of the light-emitting layer 2, and then, heat treatment is performed while applying a predetermined pressure (for example, 2 MPa), thereby directly joining the light-emitting layer 2 to the n-type ZnO wafer. The value of the predetermined pressure is not particularly limited and can be changed as appropriate according to the size of the n-type ZnO wafer. This heat treatment is performed at a temperature of 800 degrees C. under a nitrogen gas atmosphere, but these conditions are merely exemplary and not particularly limiting.

Further, in the fine peak-valley structure formation process, a resist layer (referred to hereinbelow as the first resist layer) having opened therein a region corresponding to each recess 22b is formed on the lower surface of the n-type GaN film 22 by utilizing a photolithography technique. After then, the n-type GaN film 22 is anisotropically etched by dry etching using the first resist layer as a mask and a chlorine-containing gas (for example, $Cl_2$ gas, $BCl_3$ gas, and a mixture of $Cl_2$ gas and $BCl_3$ gas) as the etching gas, thereby forming the recesses 22b. The first resist layer is thereafter removed.

When the n-type GaN film 22 is anisotropically etched in the above-described process, the aforementioned flat portion 22a is covered by the first resist layer.

Further, in the electrode formation process, a resist layer (referred to hereinbelow as the second resist layer) in which the assumed formation regions of the cathode 4 and the anode 5 are open is formed at the lower side of the n-type ZnO wafer by using a photolithography technique, and then, the cathode 4 and the anode 5 are simultaneously formed by an electron beam vapor deposition method or the like. The second resist layer and the unnecessary film superimposed on the second resist layer are then removed (lifted off) by using an organic solvent (for example, acetone).

The height (thickness) of the hexagonal pyramidal base 3 can be determined by the thickness of the n-type ZnO wafer. In the present embodiment, the n-type ZnO wafer with thickness of 500 μm is used and therefore, the height of the base 3 is 500 μm. The thickness of the n-type ZnO wafer is not particularly limited. The inclination angle of each side surfaces 33 with respect to the base surface 31 of the base 3 is determined by the crystal axis orientation of the n-type ZnO wafer. In the present embodiment, the base 3 is formed by performing the aforementioned crystal anisotropic etching with respect to the n-type ZnO wafer in which the lower side is the (0001) plane that is the Zn-polar plane and the upper side is the (000-1) plane that is the O-polar plane. Therefore, each side surface 33 of the base 3 is the (10-1-1) plane, and side surfaces 33 with an inclination angle of 60 degrees can be formed with good reproducibility. Further, in the present embodiment, crystal anisotropic etching of the n-type ZnO wafer is performed by using the mask layer of a regular hexagonal shape in the planer view thereof. Therefore, the surface area of the upper surface 32 of the base 3 can be determined by the planar size of the mask layer, and the surface area of the bottom surface 31 of the base 3 can be determined by the planar size of the mask layer and the thickness of the n-type ZnO wafer. Therefore, in order to increase the surface area of the light-emitting film 23 to raise the output, it is possible to increase the planar size of the mask layer and increase the surface area of the bottom surface 31 of the base 3, while maintaining the constant thickness of the n-type ZnO wafer.

The semiconductor light-emitting element 1 according to the present embodiment is provided with the light-emitting layer 2 having a layered structure including the p-type GaN film 24 and the n-type GaN film 22, the conductive hexagonal pyramidal base 3 formed from ZnO and mounting with the light-emitting layer on the bottom surface 31, the anode 5 joined to the bottom surface 31 of the base 3 at a position apart from the light-emitting layer 2, and the cathode 4 mounted on the light-emitting layer 2. In the semiconductor light-emitting element 1, the p-type GaN film 24 is joined to the bottom surface 31 of the base 3, and the cathode 4 is joined to the N-polar plane of the n-type GaN film 22 that is the side opposite to the p-type GaN film 24. In the semiconductor light-emitting element 1, the N-polar plane of the n-type GaN film 22, which is the side opposite that of the p-type GaN film 24, has the fine peak-valley structure 22c outside the portion where the cathode 4 is joined thereto. With such a configuration, the light generated in the light-emitting layer 2 is introduced into the base 3 with good efficiency, with suppressing absorption at the cathode 4. Therefore, light extraction efficiency is improved, and light emission efficiency is increased. In the present embodiment, the fine peak-valley structure 22c is formed by using photolithography technique and dry etching technique. Therefore, the fine peak-valley structure 22c can be formed with desired shape and size and with good reproducibility.

In the semiconductor light-emitting element 1 according to the present embodiment, the n-type GaN film 22 having the fine peak-valley structure 22c is provided on one surface of the light-emitting film 23, and the p-type GaN film 24 directly joined to the hexagonal pyramidal n-type ZnO substrate 3 is provided on the other surface. With such a configuration, the semiconductor light-emitting element 1 according to the present embodiment ensures the outgoing paths of light to both sides of the light-emitting film 23. Therefore, the number of multiple reflections of light inside the semiconductor light-emitting element 1 can be reduced, the light absorption loss caused by multiple reflections can be reduced and, therefore, light extraction efficiency is increased and light emission efficiency is increased. Further, in the semiconductor light-emitting element 1 according to the present embodiment, good ohmic contact can be obtained for both of the cathode 4 and anode 5 formed in the island-like form, and therefore the desired electric characteristic can be maintained. The cathode 4 and the anode 5 thus formed can have a reduced surface area, thereby reducing the light absorption loss at the interface of the cathode 4 and the n-type GaN film 22 and at the interface of the anode 5 and the base 3. Further, the cathode 4 of the semiconductor light-emitting element 1 according to the present embodiment is formed on the flat portion 22a, thereby making it possible to reduce the contact surface area between the cathode 4 and the n-type GaN film 22, reflect the light from the light-emitting film 23 side with better efficiency, and reduce the light absorption loss at the interface of the cathode 4 and the n-type GaN film 22 as compared with the case in which the cathode 4 is formed on the fine peak-valley structure 22c.

Further, in the semiconductor light-emitting element 1 according to the present embodiment, the light-emitting layer 2 is joined to the base 3. Since ZnO used for the base is composed of abundant and non-toxic Zn and O, the cost is reduced and stable supply is ensured. Further, in the semiconductor light-emitting element 1 according to the present embodiment, the cathode 4 and the anode 5 are formed at the bottom surface 31 side of the base 3. In addition, the inclination angle of each side surface 33 with respect to the bottom surface 31 of the base 3 is 60 degrees. Therefore, the spread angle of the outgoing light can be increased. Where the angular range in which the emitted light intensity per unit solid angle is equal to or greater than 50% of the maximum value is defined as a light outgoing angle (spread angle of the outgoing light), the light outgoing angle of the semiconductor light-emitting element 1 according to the present embodiment is equal to or greater than 120 degrees.

Embodiment 2

Figure 2A:
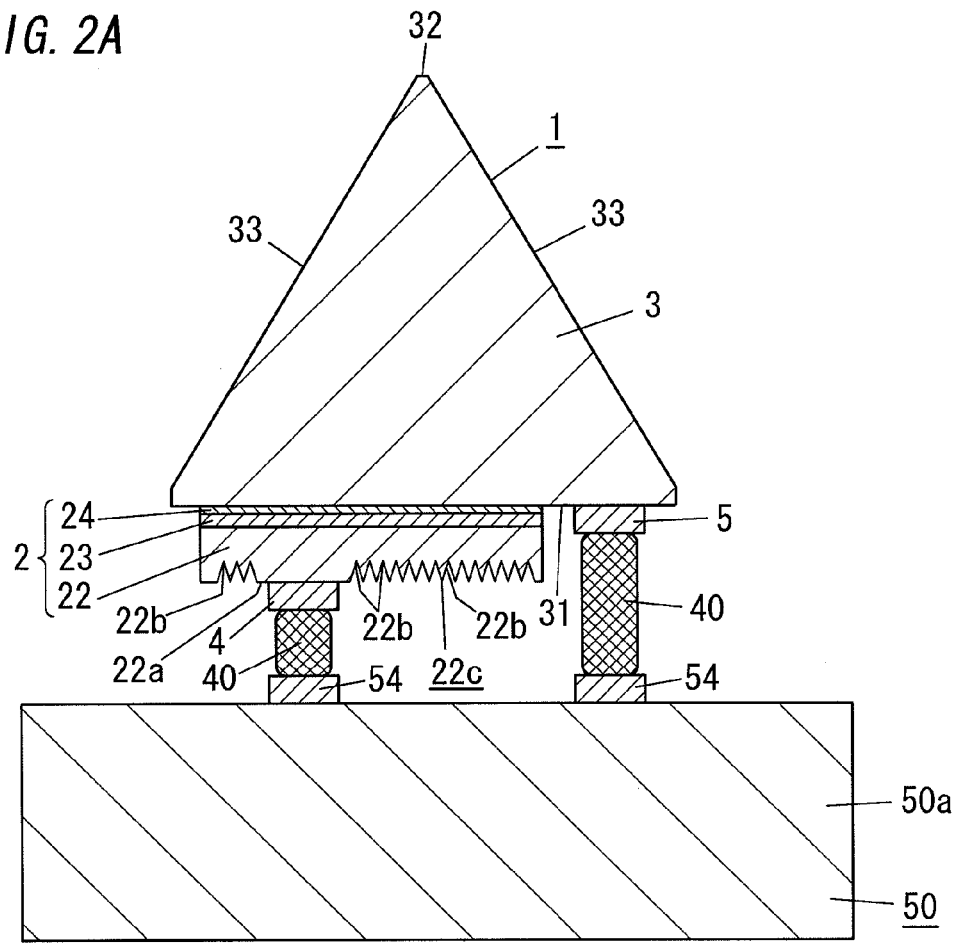
FIG. 2A is a schematic cross-sectional view illustrating a state in which the semiconductor light-emitting element is mounted on the mounting substrate.
Figure 2B:
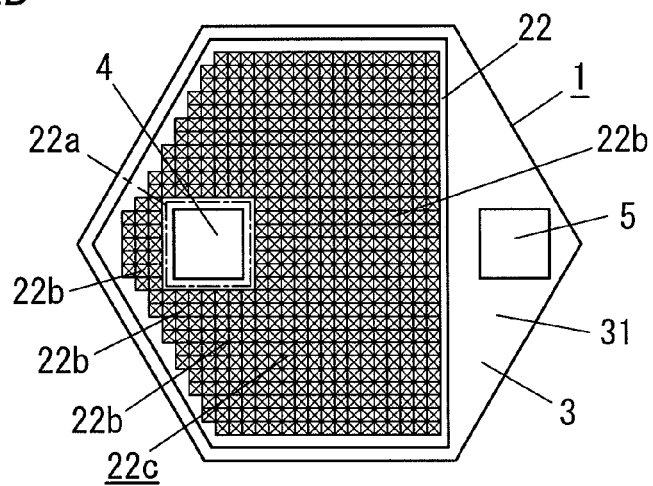
FIG. 2B is a schematic bottom view.
Figure 3:
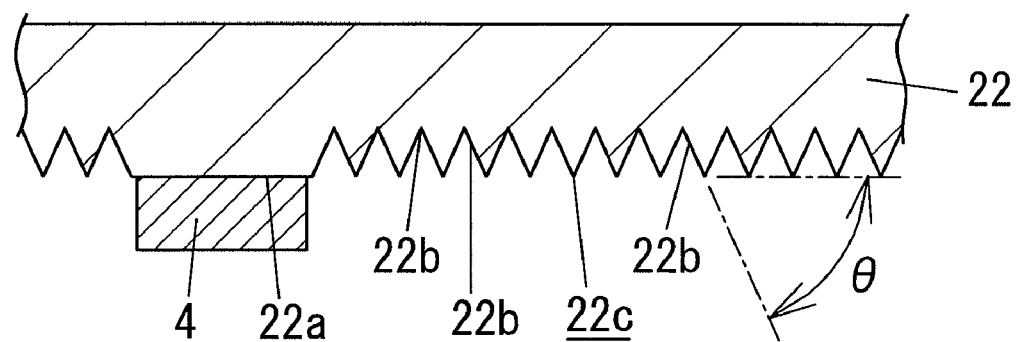
FIG. 3 is an explanatory drawing of the principal portion of the above semiconductor light-emitting element.

The basic structures of the semiconductor light-emitting element 1 and the light-emitting device according to the present embodiment that are shown in FIG. 2 and FIG. 3 are substantially identical to those of Embodiment 1 and only the shape of the fine peak-valley structure 22c is different. The constituent elements similar to those of Embodiment 1 are denoted with same reference numerals and explanation thereof is herein omitted.

The lower surface of the n-type GaN film 22 in the present embodiment has the flat portion 22a, which is the N-polar plane where the cathode electrode 4 has been formed, and the fine peak-valley structure 22c. The inner side surfaces of the recesses 22b constituting the fine peak-valley structure 22c are inclined surfaces with an inclination angle θ of less than 90 degrees with respect to the plane including the N-polar plane. Thus, the recess 22b is formed such that the opening diameter thereof increases gradually toward the N-polar plane of the n-type GaN film 22. With such a design, the semiconductor light-emitting element 1 according to the present embodiment has increased light extraction efficiency. Each recess 22b of the present embodiment is formed as a pyramidal shape (in this case, a quadrangular pyramid) with an inclination angle θ of each of the four inner side surfaces of the recess 22b of 60 degrees. The inclination angle θ is not limited to 60 degrees.

The method of manufacturing the semiconductor light-emitting element 1 according to the present embodiment is substantially identical to the manufacturing method explained in Embodiment 1, and only the fine peak-valley structure formation process in which the fine peak-valley structure 22c is formed is different. The fine peak-valley structure formation process will be explained below with reference to FIG. 4.

Figure 4A:
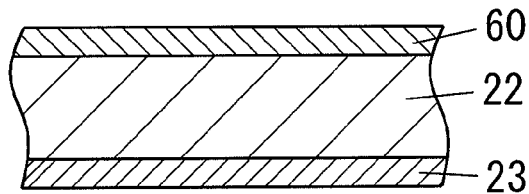
FIG. 4 is a main cross-sectional view illustrating the method of manufacturing the above semiconductor light-emitting element.
Figure 4B:
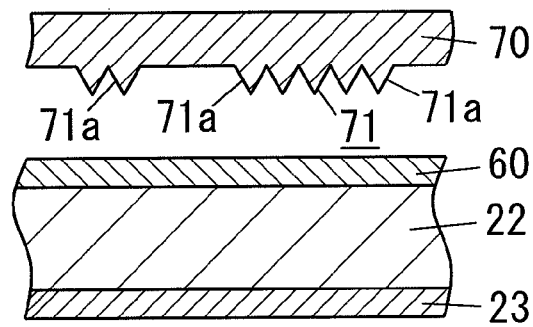
Figure 4C:
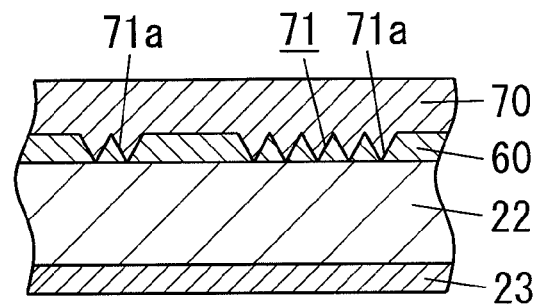
Figure 4D:
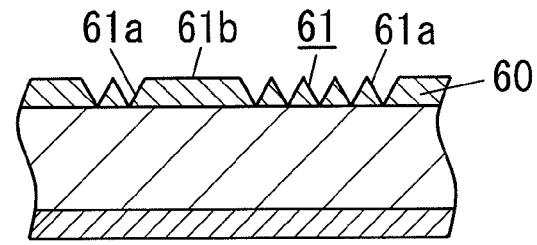

In the fine peak-valley structure formation process, the structure shown in FIG. 4A is obtained by forming a transfer layer 60 on the lower side (upper side in FIG. 4) of the n-type GaN film 22 (transfer layer formation process). Then, a mold 70 having formed thereon a peak-valley pattern 71 designed correspondingly to the fine peak-valley structure 22c is pressed against the transfer layer 60, and the peak-valley pattern 71 is transferred to the transfer layer 60 (transfer process). In the transfer layer formation process, the transfer layer 60 is formed by coating a resist such as PMMA by a spin coating method. In the transfer process, the mold 70 is faced to be aligned correspondingly to the transfer layer 60 as shown in FIG. 4B, the transfer layer 60 is heated to be softened, the mold 70 is brought into contact with the transfer layer 60, and the predetermined pressure is applied to the mold 70, thereby deforming the transfer layer 60 as shown in FIG. 4C. The transfer layer 60 is cooled and then the mold 70 is separated from the transfer layer 60 to obtain the structure shown in FIG. 4D. The peak-valley pattern 71 of the mold 70 is formed by arranging two-dimensionally the quadrangular pyramidal protrusions 71a. The transfer layer 60 is patterned to a form in which quadrangular pyramidal recesses 61a are arranged two-dimensionally. The mold 70 is designed such that the recesses 61a are not formed on the corresponding portion 61b in the transfer layer 60 where corresponding to the flat portion 22a of the n-type GaN film 22. In the transfer layer formation process, the transfer layer 60 is heated and cooled, but it is also possible to heat and cool the mold 70, rather than the transfer layer 60. The material of the transfer layer 60 is not limited to a resist.

Figure 4E:
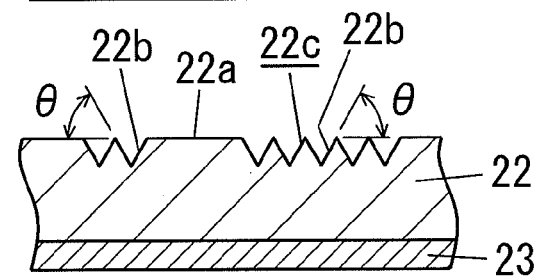

After the transfer process, the transfer layer 60 and the n-type GaN film 22 are dry etched to form the fine peak-valley structure 22c with an inclination angle θ on the lower surface of the n-type GaN layer 22. As a result, the structure shown in FIG. 4E is obtained. A chlorine-containing gas (for example, $Cl_2$, $BCl_3$, or a mixture of $Cl_2$ and $BCl_3$) is used as the etching gas.

This method of manufacturing the semiconductor light-emitting element 1 according to the present embodiment makes it possible to form the fine peak-valley structure 22c at low cost and with good reproducibility and increases the light emission efficiency.

Embodiment 3

Figure 5:
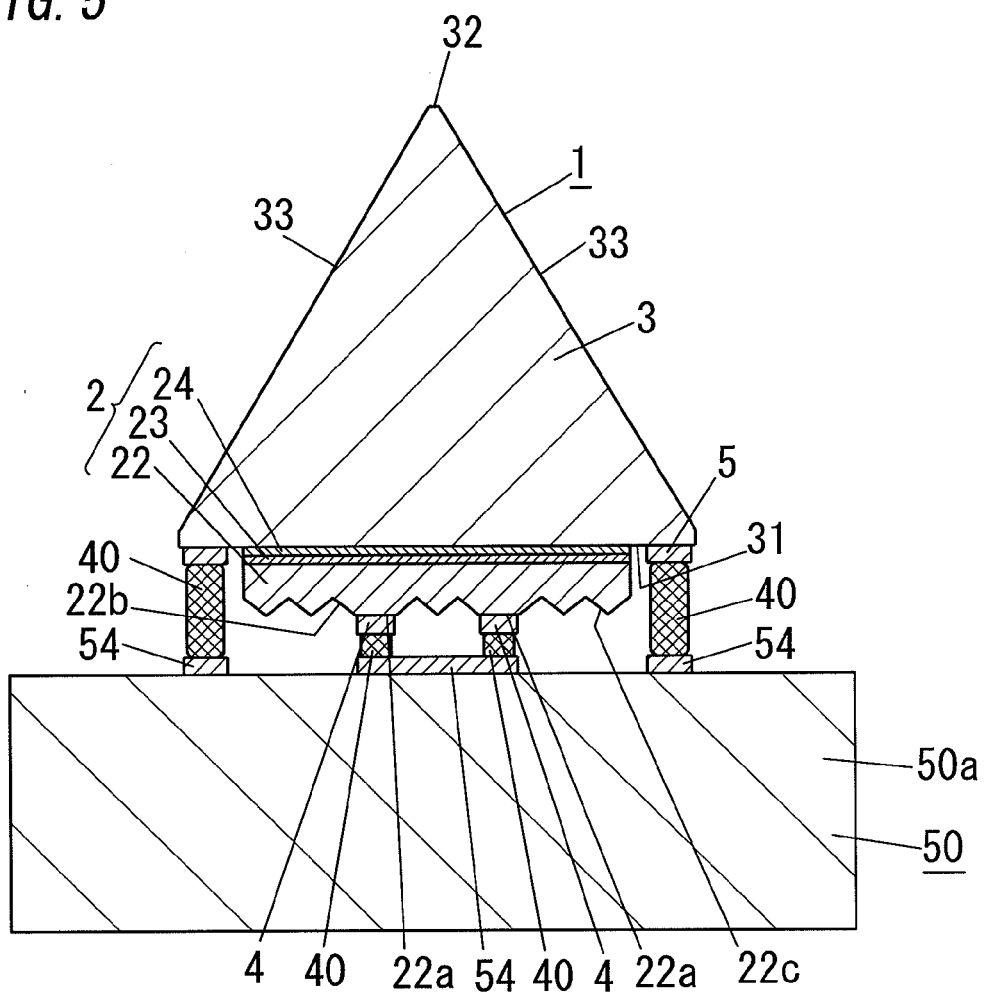
FIG. 5 is a schematic cross-sectional view illustrating a state in which the semiconductor light-emitting element according to Embodiment 3 is mounted on the mounting substrate.

The basic structures of the semiconductor light-emitting element 1 and the light-emitting device according to the present embodiment that are shown in FIG. 5 are substantially identical to those of Embodiment 2, and only the shape of the fine peak-valley structure 22c (inclination angle θ shown in FIG. 3) and the number of flat portions 22a of the n-type GaN film 22, the number of the cathodes 4, and the number of the anodes 5 (in the present embodiment, two of each) are different. The constituent elements similar to those of Embodiment 2 are denoted with same reference numerals and explanation thereof is herein omitted.

In the semiconductor light-emitting element 1 according to the present embodiment, the cathode 4 and the anode 5 are constituted by a laminated film of an Al film and a Au film. The thickness of the Al film is set to 100 nm and the thickness of the Au film is set to 500 nm. These thicknesses are not particularly limited. The laminated films of the cathode 4 and the anode 5 are not limited to the laminated film of the Al film and the Au film and may be, for example, a laminated film of a Ti film, an Al film and a Au film, a laminated film of a Ti film and a Au film, and a laminated film of a Ti film, an Al film, a Ni film, and a Au film.

Figure 6:
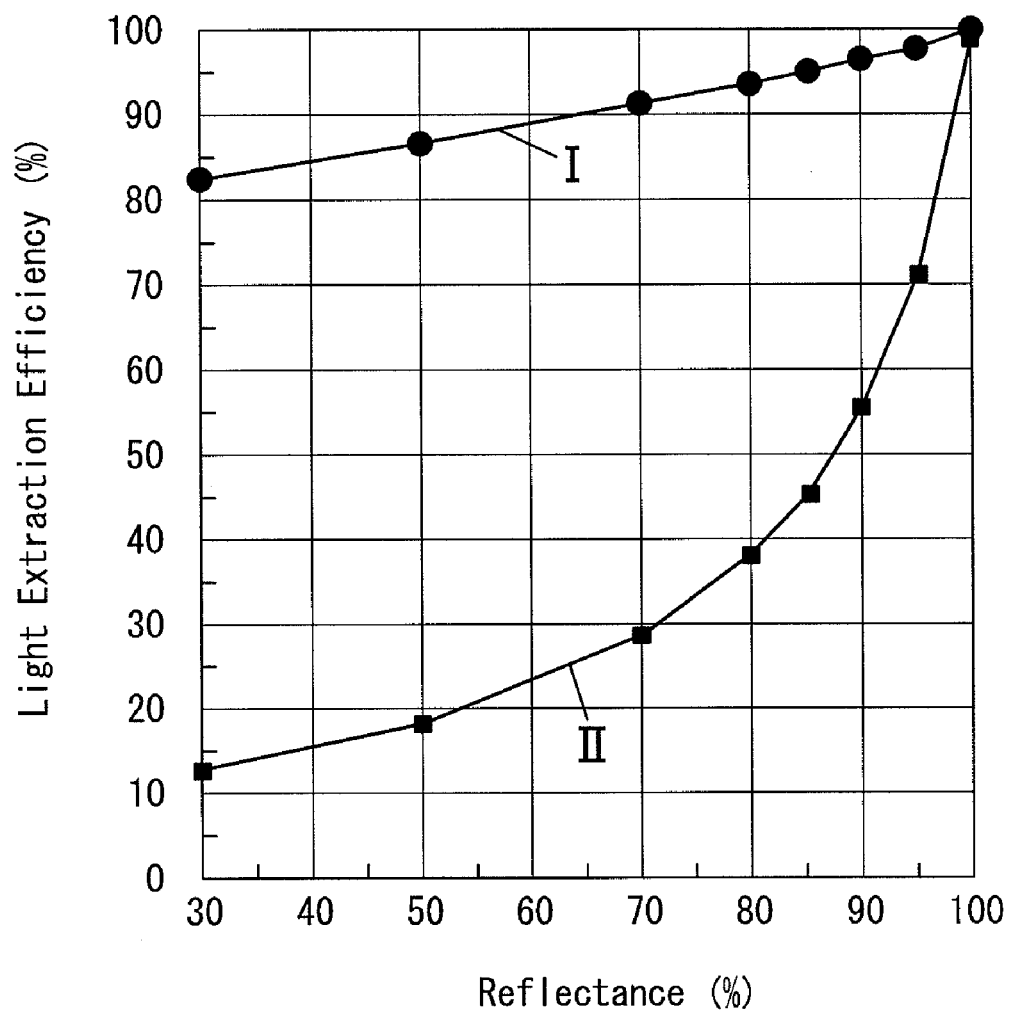
FIG. 6 is a characteristic explanatory drawing of the above semiconductor light-emitting element.
Figure 8:
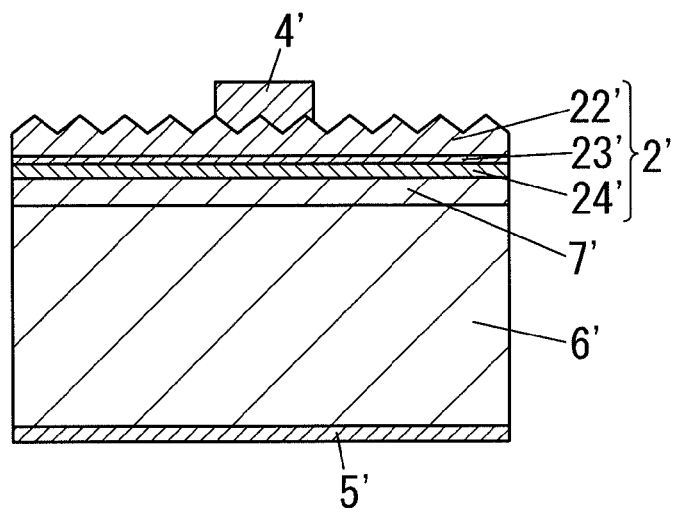
FIG. 8 is a schematic cross-sectional view of a semiconductor light-emitting element of the conventional example.
Figure 9:
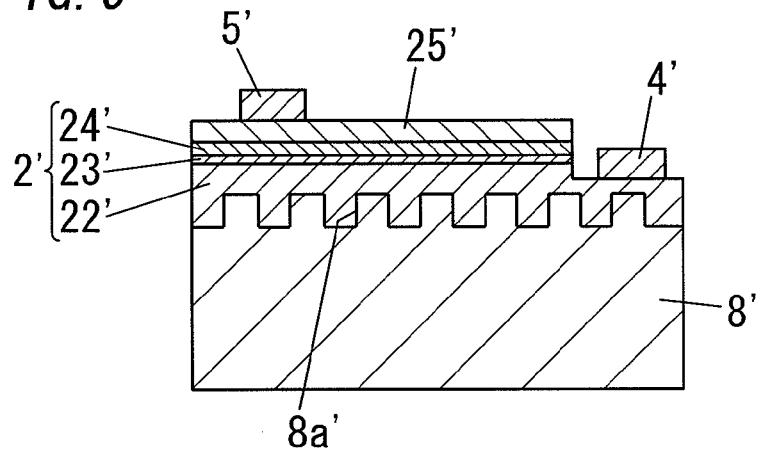
FIG. 9 is a schematic cross-sectional view of a semiconductor light-emitting element of another conventional example.
Figure 10:
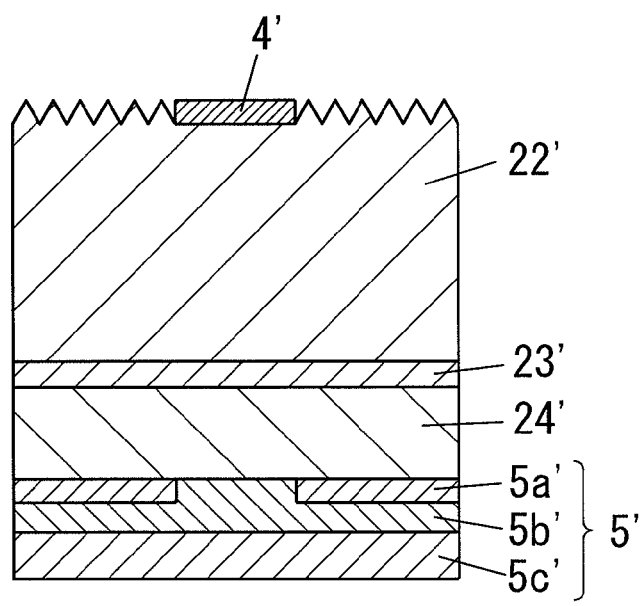
FIG. 10 is a schematic cross-sectional view of a semiconductor light-emitting element of yet another conventional example.

FIG. 6 shows simulation results on the light extraction efficiency in the case in which the reflectance is changed. In the figure, the curve I relates to the case in which the reflectance (light reflectance) of the cathode 4 and the anode 5 is changed in the semiconductor light-emitting element 1 shown in FIG. 5, and the curve II relates to the case in which the reflectance of the cathode 4' and the metal film 7' is changed in the semiconductor light-emitting element of the conventional example shown in FIG. 8. FIG. 6 demonstrates that the light extraction efficiency increases with increase in reflectance in both the embodiment and the conventional example, but the light extraction efficiency in the present embodiment is higher than that in the conventional example. As in the case with a reflectance of Al with respect to light with a wavelength of 460 nm (about 92%), the light extraction efficiency in the present embodiment (about 97%) is much higher than in the conventional example (about 63%). In the semiconductor light-emitting element of the conventional example shown in FIG. 8, the flat metal film 7' is formed on the entire upper surface of the Si substrate 6', and the decrease in light extraction efficiency caused by light absorption loss strongly depends on the reflectance of the metal film 7'. By contrast, in the semiconductor light-emitting element 1 according to the present embodiment, the interface surface area between the n-type GaN film 22 and the cathode electrode 4, which is the cause of light absorption loss, is reduced. In addition, the n-type GaN film 22 having the fine peak-valley structure 22c is provided on one side in the thickness direction of the light-emitting film 23, and the hexagonal pyramidal n-type ZnO substrate 3 directly joined to the p-type GaN film 24 is provided at the other side. Therefore, in the semiconductor light-emitting element 1 according to the present embodiment, the light is released to the outside with better efficiency than in the conventional example and therefore the light extraction efficiency is realized that is much higher than that of the conventional example.

In the semiconductor light-emitting element 1 according to the present embodiment, the light extraction efficiency is increased and therefore a very high value of 97% of light extraction efficiency is obtained despite the fact that Al, which does not have a high reflectance, is used in the cathode 4 as the metal material contacting with the n-type GaN film 22. Further, in the present embodiment, the freedom of selecting the electrode material of the cathode 4 can be increased, the electrode formation process can be facilitated, and the productivity in production of semiconductor light-emitting elements 1 with high light emission efficiency can be increased.

Embodiment 4

Figure 7:
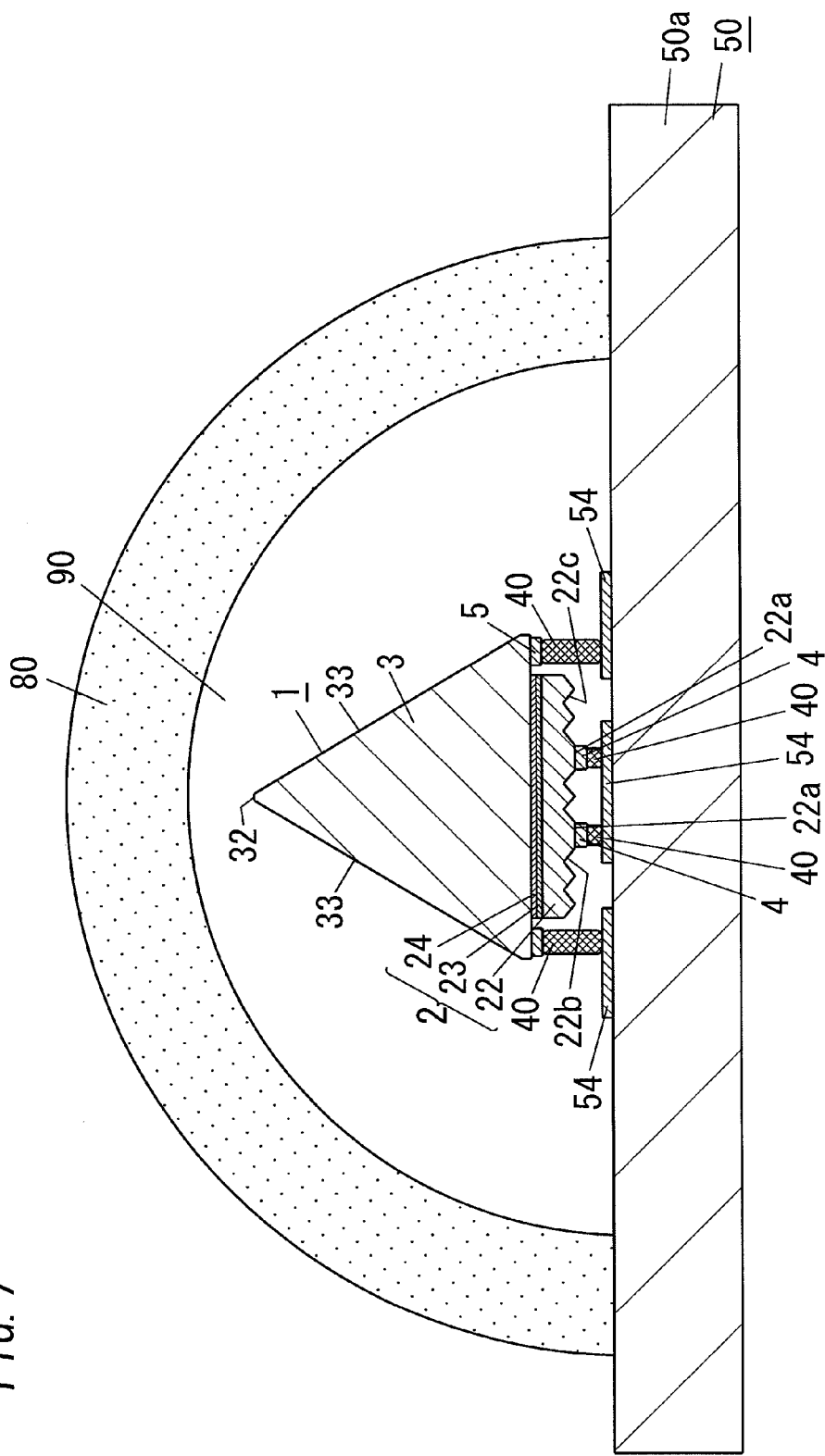
FIG. 7 is a schematic cross-sectional view of the light-emitting device according to Embodiment 4.

The basic structure of the light-emitting device according to the present embodiment that is shown in FIG. 7 is substantially identical to that of Embodiment 3, the difference being that the dome-shaped color conversion member 80 is provided on the mounting substrate 50 so as to surround the semiconductor light-emitting element 1. The color conversion member 80 is formed from a light transmitting material including a fluorescent material, said fluorescent material being a wavelength conversion material and emitting light with a wavelength longer than that of the semiconductor light-emitting element 1 when excited by the light emitted from the semiconductor light-emitting element 1. The constituent elements similar to those of Embodiment 3 are denoted with same reference numerals and explanation thereof is herein omitted.

In the light-emitting device according to the present embodiment, similarly to the light-emitting device of Embodiment 1, a reflective film (not shown in the figure) that reflects the light emitted from the semiconductor light-emitting element 1 towards the mounting substrate 50 side is provided on the mounting substrate 50. A white resist having insulating properties and a high reflectance with respect to the light emitted from the semiconductor light-emitting element 1 is used as the material of the reflective film. Since no short circuit occurs when the wiring pattern 54 and the reflective film formed from an insulating material are laminated, the light-emitting device according to the present embodiment can be configured such that the upper surface of the insulating substrate 50a of the mounting substrate 50 is not exposed. By contrast, when the reflective film is formed from a conductive material such as a metal, a gap should be provided between the reflective film and the wiring pattern 54 to prevent the short circuit with the wiring pattern 54. As a result, part of the upper surface of the insulating substrate 50a is exposed. When the insulating substrate 50a is formed from a material with a reflectance lower than that of AlN, AlN may be used as the material of the reflective film.

An edge (circumferential edge of an opening) of the color conversion member 80 at the mounting substrate 50 side is fixedly attached to the mounting substrate 50 with an adhesive (for example, a silicone resin or an epoxy resin).

In the color conversion member 80, a fluorescent material (fluorescent material particles) are dispersed in a light transmitting material (for example, a silicone resin) that has a refractive index lower than that of the fluorescent material. Red fluorescent material particles and green fluorescent material particles are used as the fluorescent material. Therefore, according to the light-emitting device of the present embodiment, light emitted from the red fluorescent material particles and the green fluorescent material particles of the color conversion member 80 as well as blue light emitted from the semiconductor light-emitting element 1 are emitted through a light outgoing surface (outer surface) of the color conversion member 80, thereby making it possible to obtain white light. The fluorescent material disposed in the color conversion member 80 is not limited to the combination of the red fluorescent material particles and green fluorescent material particles, and may be, for example, a combination of yellow fluorescent material particles, green fluorescent material particles, and orange fluorescent material particles or a combination of greenish yellow fluorescent material particles and orange fluorescent material particles. Further, white light may be also obtained by using the semiconductor light-emitting element 1 that emits ultraviolet light and a fluorescent material including red fluorescent material particles, green fluorescent material particles, and blue fluorescent material particles. The light transmitting material of the color conversion member 80 is not limited to the silicone resin and may be, for example, glass. By using a silicone resin or glass, the light transmitting material can be prevented from deterioration induced by excitation light when blue light or violet light which is a typical excitation light is used as the excitation light. Further, the light transmitting material of the color conversion member 80 is not limited to a silicone resin and glass and may be, for example, an acrylic resin or an organic-inorganic hybrid material in which an organic component and an inorganic component are mixed and bonded at a nanometer level or molecular level.

In the light-emitting device of the above-described embodiment, the light extraction efficiency of the semiconductor light-emitting element 1 is higher than that in the conventional example. Furthermore, the reflective film that reflects light emitted from the semiconductor light-emitting element 1 toward the mounting substrate 50 side is provided on the mounting substrate 50, in addition to the plurality of wiring patterns 54, 54 which are separately joined by the bumps 40, 40 to the cathode 4 and the anode 5 of the semiconductor light-emitting element 1. Therefore, the light emission efficiency of the mixed light of the light emitted from the semiconductor light-emitting element 1 and the light emitted from the fluorescent material is increased. Further, in the light-emitting device according to the present embodiment, a gas layer (for example, an air layer) 90 is introduced between the color conversion member 80 and the semiconductor light-emitting element 1, and the quantity of light returning to the semiconductor light-emitting element 1 side from among the light that has been radiated from the semiconductor light-emitting element 1 to be fallen on the color conversion member 80 and be scattered by the fluorescent material located in the color conversion member 80, can be reduced. The resultant merits are that the extraction efficiency of the mixed light of the light emitted from the semiconductor light-emitting element 1 and the light emitted from the fluorescent material of the color conversion'member 80 can be increased, the light output can be increased, and moisture contained in the external atmosphere can be prevented from reaching the semiconductor light-emitting element 1. The gas of the gas layer 90 is not limited to the air and can be, for example, nitrogen gas.

Further, in the light-emitting device according to the present embodiment, a cover member formed only from a light transmitting material and containing no fluorescent material may be used instead of the color conversion member 80. In this case, it is possible to realize a light-emitting device with a high light emission efficiency with respect to the light of the emission color identical to that of the semiconductor light-emitting element 1.

In the above-described embodiments, the light-emitting film 23 is designed such that the light emitted from the semiconductor light-emitting element 1 is blue light. However, the light emitted from the semiconductor light-emitting element 1 is not limited to the blue light and may be, for example, red, green, violet, or ultraviolet light.

The invention claimed is:

1. A semiconductor light-emitting element, comprising:
   a light-emitting layer having a laminated structure in which a p-type GaN film and an n-type GaN film are included;
   a conductive hexagonal pyramidal base formed from ZnO and mounted with the light-emitting layer on a bottom surface thereof;
   an anode joined to the bottom surface of the base at a position apart from the light-emitting layer; and
   a cathode mounted on the light-emitting layer,
   wherein
   the p-type GaN film is joined to the bottom surface of the base,
   the cathode is joined to an N-polar plane of the n-type GaN film, said N-polar plane being an opposite side to the p-type GaN film, and
   the N-polar plane of the n-type GaN film has a fine peak-valley structure outside a portion joined to the cathode, said N-polar plane being said opposite side to the p-type GaN film.

2. The semiconductor light-emitting element according to claim 1, wherein the fine peak-valley structure is composed of a plurality of recesses arranged two-dimensionally over the N-polar plane of the n-type GaN.

3. The semiconductor light-emitting element according to claim 2, wherein an opening diameter of each of the recesses gradually increases toward the N-polar plane side of the n-type GaN film.

4. The semiconductor light-emitting element according to claim 3, wherein each of the recesses has a pyramidal shape.

5. The semiconductor light-emitting element according to claim 1, wherein the cathode and the anode are composed of a laminated film selected from: a laminated film of a Ti film, an Al film, and a Au film; a laminated film of a Ti film and a Au film; a laminated film of an Al film and a Au film; and a laminated film of a Ti film, an Al film, a Ni film, and a Au film.

6. A method of manufacturing a semiconductor light-emitting element, in which
   a light-emitting layer having a laminated structure of a p-type GaN film and an n-type GaN film is formed;
   the p-type GaN film of the light-emitting layer is joined to a bottom surface of a hexagonal pyramidal base formed from ZnO;
   an anode is joined to the bottom surface of the base at a position apart from the light-emitting layer;
   a cathode is joined to an N-polar plane of the n-type GaN film, said N-polar plane of the n-type GaN film being an opposite side to the p-type GaN film; and
   a fine peak-valley structure is formed on the N-polar plane of the n-type GaN film outside a portion joined to the cathode, said N-polar plane of the n-type GaN film being said opposite side to the p-type GaN film,
   the method comprising:
   forming a transfer layer on the N-polar plane of the n-type GaN film;
   pressing a mold die having a predetermined peak-valley pattern on one surface thereof against the transfer layer and transferring the peak-valley pattern to the transfer layer; and
   dry etching the transfer layer and the n-type GaN layer from surface side and etching out the transfer layer and part of the N-polar plane of the n-type GaN layer, whereby the fine peak-valley structure is formed on the N-polar plane of the n-type GaN film.

7. A light-emitting device, comprising:
   the semiconductor light-emitting element according to claim 1;
   a mounting substrate mounted with the semiconductor light-emitting element on one surface side thereof; and
   a light conversion member that is formed from a transparent material including a fluorescent material excited by light emitted from the semiconductor light-emitting element and emits light having a wavelength longer than that of the semiconductor light-emitting element, said light conversion member being formed in a dome-shape and being provided so as to surround the semiconductor light-emitting element between the mounting substrate and the light conversion member, wherein the mounting substrate is provided, on said one surface side thereof, with: a plurality of wiring patterns connected separately from each other by bumps to the cathode and the anode of the semiconductor light-emitting element; and a reflective film that reflects light emitted from the semiconductor light-emitting element towards the mounting substrate side.

8. The semiconductor light-emitting element according to claim 2, wherein the cathode and the anode are composed of a laminated film selected from: a laminated film of a Ti film, an Al film, and a Au film; a laminated film of a Ti film and a Au film; a laminated film of an Al film and a Au film; and a laminated film of a Ti film, an Al film, a Ni film, and a Au film.

9. The semiconductor light-emitting element according to claim 3, wherein the cathode and the anode are composed of a laminated film selected from: a laminated film of a Ti film, an Al film, and a Au film; a laminated film of a Ti film and a Au film; a laminated film of an Al film and a Au film; and a laminated film of a Ti film, an Al film, a Ni film, and a Au film.

10. The semiconductor light-emitting element according to claim 4, wherein the cathode and the anode are composed of a laminated film selected from: a laminated film of a Ti film, an Al film, and a Au film; a laminated film of a Ti film and a Au film; a laminated film of an Al film and a Au film; and a laminated film of a Ti film, an Al film, a Ni film, and a Au film.

11. A light-emitting device, comprising:
the semiconductor light-emitting element according to claim 2;
a mounting substrate mounted with the semiconductor light-emitting element on one surface side thereof; and
a light conversion member that is formed from a transparent material including a fluorescent material excited by light emitted from the semiconductor light-emitting element and emits light having a wavelength longer than that of the semiconductor light-emitting element, said light conversion member being formed in a dome-shape and being provided so as to surround the semiconductor light-emitting element between the mounting substrate and the light conversion member,
wherein the mounting substrate is provided, on said one surface side thereof, with: a plurality of wiring patterns connected separately from each other by bumps to the cathode and the anode of the semiconductor light-emitting element; and a reflective film that reflects light emitted from the semiconductor light-emitting element towards the mounting substrate side.

12. A light-emitting device, comprising:
the semiconductor light-emitting element according to claim 3;
a mounting substrate mounted with the semiconductor light-emitting element on one surface side thereof; and
a light conversion member that is formed from a transparent material including a fluorescent material excited by light emitted from the semiconductor light-emitting element and emits light having a wavelength longer than that of the semiconductor light-emitting element, said light conversion member being formed in a dome-shape and being provided so as to surround the semiconductor light-emitting element between the mounting substrate and the light conversion member,
wherein the mounting substrate is provided, on said one surface side thereof, with: a plurality of wiring patterns connected separately from each other by bumps to the cathode and the anode of the semiconductor light-emitting element; and a reflective film that reflects light emitted from the semiconductor light-emitting element towards the mounting substrate side.

13. A light-emitting device, comprising:
the semiconductor light-emitting element according to claim 4;
a mounting substrate mounted with the semiconductor light-emitting element on one surface side thereof; and
a light conversion member that is formed from a transparent material including a fluorescent material excited by light emitted from the semiconductor light-emitting element and emits light having a wavelength longer than that of the semiconductor light-emitting element, said light conversion member being formed in a dome-shape and being provided so as to surround the semiconductor light-emitting element between the mounting substrate and the light conversion member,
wherein the mounting substrate is provided, on said one surface side thereof, with: a plurality of wiring patterns connected separately from each other by bumps to the cathode and the anode of the semiconductor light-emitting element; and a reflective film that reflects light emitted from the semiconductor light-emitting element towards the mounting substrate side.

* * * * *